United States Patent [19]
Itoh

[11] Patent Number: 5,213,153
[45] Date of Patent: May 25, 1993

[54] HEAT RADIATING DEVICE
[75] Inventor: Satomi Itoh, Hyogo, Japan
[73] Assignee: Itoh Research & Development Laboratory Co., Ltd., Osaka, Japan
[21] Appl. No.: 853,417
[22] Filed: Mar. 17, 1992
[30] Foreign Application Priority Data
  Mar. 20, 1991 [JP] Japan .................. 3-130845
[51] Int. Cl.$^5$ ............................................ F28D 15/02
[52] U.S. Cl. .............................. 165/104.33; 165/80.3; 165/104.14; 165/185; 361/385
[58] Field of Search ................ 165/185, 80.3, 164, 165/104.14, 104.33; 361/385

[56] References Cited
U.S. PATENT DOCUMENTS 4,588,023 5/1986 Munekawa .................. 361/385
5,029,638 7/1991 Valenzuela .................. 165/185

FOREIGN PATENT DOCUMENTS 0123795 11/1984 European Pat. Off. .
0401743 12/1990 European Pat. Off. .

Primary Examiner—Albert W. Davis, Jr.
Attorney, Agent, or Firm—W. G. Fasse

[57] ABSTRACT

A radiating device 10 has a rectangular parallelepiped block 11. Block 11 includes a first group of holes 12 to 19 and a second group of holes 20 to 23 causing convection of air. Passages for circulating gas and liquid serving as a heat pipe, are formed to extend in X, Y and Z directions in block 11. Opening ends of respective passages are closed by pins 51. The air heated in the holes is discharged to the atmosphere from the top surface of the block through the second group of holes. Accordingly, cool air in the atmosphere absorbed in the holes of the first group, carries the heat generated from the inner wall surface of the holes, is discharged to the atmosphere from the top surface of the block. Working fluid sealed in the passage frequently repeats an evaporation and condensation. The liquid condensed at the radiating portion returns to the heated portion along an inner wall surface defining the passage.

10 Claims, 13 Drawing Sheets

HEAT RADIATING DEVICE

FIELD OF THE INVENTION

The present invention relates to a heat radiating device for dissipating heat from an electronic component such as a semiconductor integrated circuit package to the atmosphere.

BACKGROUND INFORMATION

Recently, a higher responsiveness and a higher integration of integrated circuits used for electronic devices such as computers have been in greater demand. Accordingly, the power consumption of an integrated circuit has been increased, and the temperature of the electronic component in operation has been increased accordingly. In order to cool the electronic component, a radiating device such as a heat sink has been used.

FIG. 16 shows a conventional radiating device 2 placed on a semiconductor integrated circuit package 1. The radiating device 2 includes a thin rectangular base plate 3 which is in surface-contact with the top surface of the semiconductor integrated circuit package 1, and a number of pins 4 erected on the top surface of the base plate 3 so as to increase the surface area of the radiating device. Typically, the radiating device 2 is formed of aluminum. The heat of the semiconductor integrated circuit package 1 is transmitted to the radiating device 2, and is radiated to the atmosphere from the surface of the radiating device 2.

FIG. 17 shows a conventional fin type radiating device 5. The radiating device 5 includes a circular base plate 6 which is in surface-contact with the top surface of the semiconductor integrated circuit package, and a plurality of fins 7 erected on the top surface of the base plate 6 so as to increase the surface area of the radiating device. Typically, the radiating device 5 of this type is also formed of aluminum.

In the conventional radiating device such as shown in FIGS. 16 and 17, the effect of radiation is improved by increasing the surface area. However, such conventional devices do not provide a satisfactory effect when used with modern electronic components having a higher responsiveness and a higher integration.

A heat pipe has been known as another example of a radiating device for cooling an electronic component. A heat pipe is obtained by reducing the inner pressure in an air tight container formed by closing both ends of a pipe, and by sealing a heat carrier such as water or alcohol, which is called a working fluid in the pipe. At a heated portion of the heat pipe, the fluid turns to steam or gas, the gas radiates heat when it moves away from the heated portion, and again turns into liquid. The liquid returns to the heated portion because of capillary action. The heat is transmitted from the heated portion to the radiating portion by the repetition of this phenomenon.

A heat pipe is placed on a top surface of an electronic component in order to cool the electronic component such as a semiconductor integrated circuit package. Since the heat pipe is linearly in contact with the electronic component, the efficiency of the heat transmission from the electronic component to the heat pipe is not good.

SUMMARY OF THE INVENTION

IT is an object of the present invention to provide a radiating device having a superior radiating characteristic compared to conventional radiating devices.

Another object of the present invention is to provide a radiating device in which the efficiency of radiation can be improved, not relying on an increase in surface area.

A further object of the present invention is to provide a radiating device including a heat pipe with a larger area for receiving heat from the electronic component.

According to a first aspect of the present invention, the radiating device has the shape of a block defined by a bottom wall with a surface serving as a heat receiving surface, a top wall with surface, and a side wall with a surface for coupling the bottom wall and the top wall together to form the block. The block includes a first group of holes extending through the side surface, and a second group of holes extending to the top wall whereby the second group of and holes are crossing the first group of holes.

When the radiating device is placed on an electronic component, the block as a whole is heated by the heat from the electronic component. Since an inner wall surface defining the second group of holes is also heated, air in the second group of holes is also heated. The heated air is radiated or rather discharged to the atmosphere from the top surface of the block. Because of the discharge of the heated air to the atmosphere, pressure in the second group of holes is reduced, so that air is absorbed into the first group of holes. Accordingly, cool air in the atmosphere is absorbed in the first group of holes. Thus a convection phenomenon is repeated in which the cool air in the atmosphere is absorbed in the first group of holes, and radiated through the second group of holes to the atmosphere. The air passing through the first group of holes and through the second group of hole picks up heat emitted from the wall surfaces of the holes and transports the pick-up heat to the pick-up heat to the atmosphere. According to the first aspect of the present invention, a radiating device having an improved radiation characteristic utilizing convection of air for the heat transport, is provided.

According to another aspect of the present invention, the radiating device has the shape of a block with a bottom wall acting as heat receiving surface. The block includes passage means therein for circulating gas and liquid, thereby serving as a heat pipe. The bottom surface of the block is in surface-contact with the top surface of the electronic component. Therefore, heat sur from the electronic component is transmitted with a high efficiency to the block. The heat transmitted from the electronic component heat the entire block. The passage for circulating gas and liquid serving as a heat pipe is formed in the block, whereby the inner wall surface defining the gas circulating passage is entirely heated. The working fluid sealed in the passage repeats the evaporation and condensation frequently. Liquid condensed at the radiating portion returns to the heated portion of the inner wall surface defining the passage. According to the second aspect, a radiating device having a heat pipe structure with a superior efficiency in the heat reception and a superior radiating characteristic, has been provided.

According to a further aspect of the present invention, the radiating device has the shape of a block defined by a bottom wall with a bottom surface serving as a heat receiving surface, a top wall with surface, and a side wall with a respective side surface for coupling the top wall and the bottom wall to each other for forming the block. The block includes a first group of holes extending through the side surface region, a second group of holes extending to the top surface region crossing the first group of holes, and a passage for circulating gas and liquid whereby the passage or passages serve as a heat pipe.

The radiating device in accordance with the third aspect provides both advantages of the radiating devices in accordance with the first and the second aspects.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
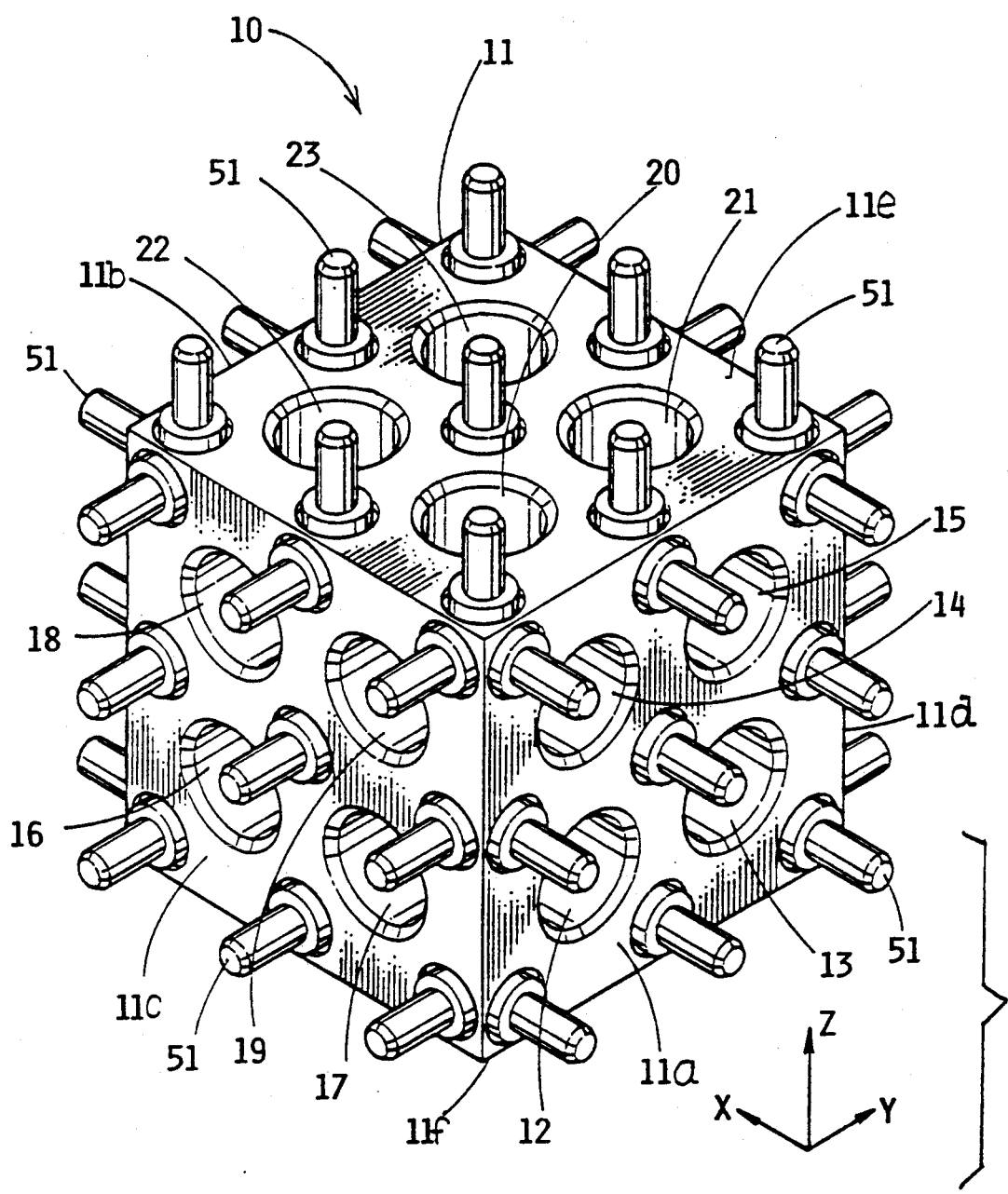
FIG. 1 is a perspective view showing one embodiment of the present invention.

A radiating device 10 in accordance with one embodiment of the present invention shown in FIG. 1 includes a block 11 formed of aluminum. Block 11 has a cubic shape defined by a front wall with a surface 11a, a rear wall with a surface 11b, a left side wall with a surface 11c, a right side wall with a surface 11d, a top wall with a top surface 11e and a bottom wall with a bottom surface 11f. Bottom surface 11f of block 11 serves as a heat receiving surface which is brought into surface-contact with an electronic component such as a semiconductor integrated circuit package not shown. In order to improve the efficiency of heat transmission from the electronic component to the block 11, the bottom surface 11f of block 11 is polished.

For convenience of description, a direction coupling the front surface 11a and the rear surface 11b of block 11, is referred to as "X direction", the direction coupling the left side surface 11c and the right side surface 11d, is referred to as "Y direction", and the direction coupling the bottom surface 11f and the top surface 11e is referred to as "Z direction".

Block 11 includes a first group of holes extending through the side surfaces of block 11, and a second group of holes extending to the top surface and crossing the first group of holes. In the embodiment shown, the first group of holes includes four through holes 12, 13, 14 and 15 formed to pierce through the front wall surface 11a and through the rear wall surface 11b of block 11, and four through holes 16, 17, 18 and 19 formed to pierce through the left side wall surface 11c and through the right side wall surface 11d. The second group of holes includes four holes 20, 21, 22 and 23 extending downwardly from the top wall surface 11e of block 11. Through holes 12, 13, 14 and 15 extend in the X direction, through holes 16, 17, 18 and 19 extend in the Y direction, and holes 20, 21, 22 and 23 extend in the Z direction.

Figure 2:
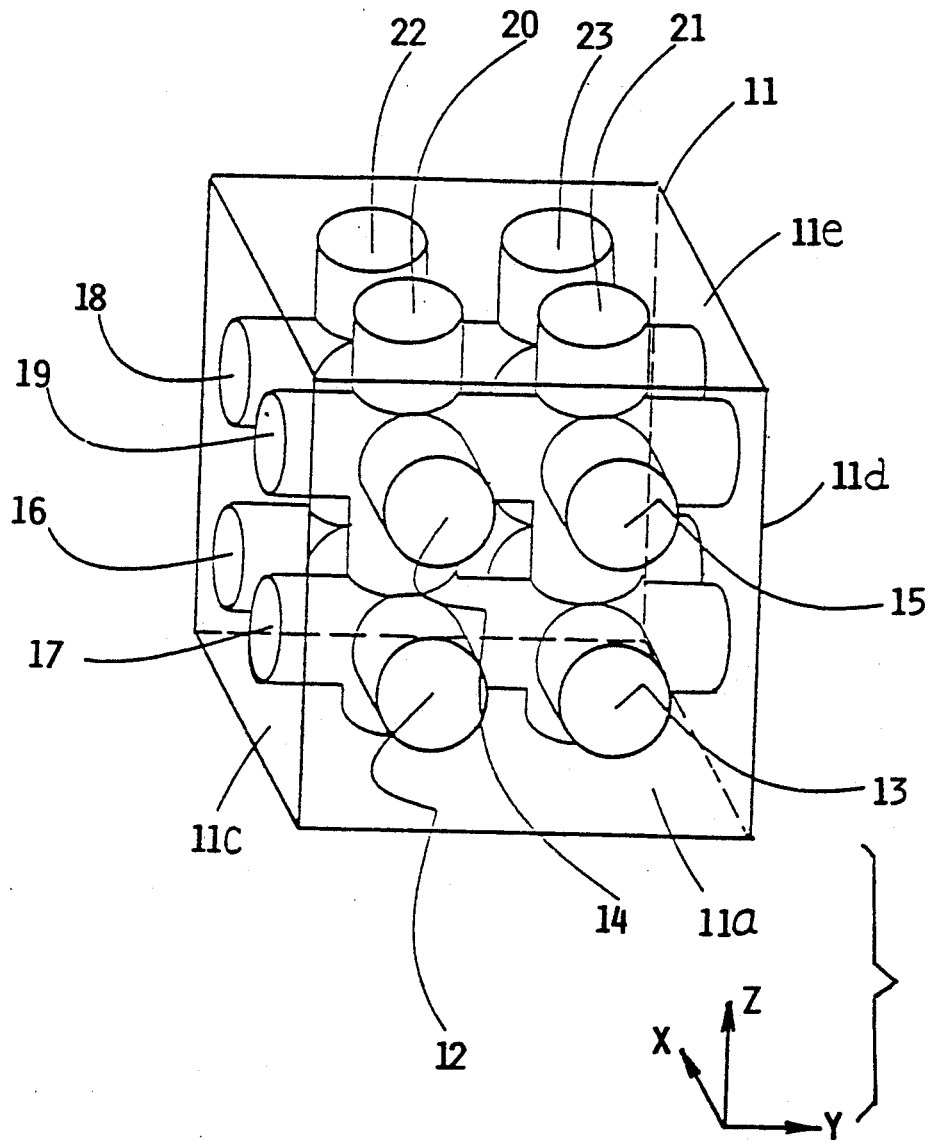
FIG. 2 is a schematic diagram showing the formation of the first and second groups of holes.

FIG. 2 illustrates the form of the first group of holes and the second group of holes. As shown in FIG. 2, the through holes 12 and 13 extending in the X direction cross the through holes 15 and 17 extending in the Y direction. Similarly, the through holes 14 and 15 positioned above and extending in the X direction cross the through holes 18 and 19 extending in the Y direction. Holes 20, 21, 22 and 23 extending in the Z direction are formed to cross the crossings of through holes extending in the X direction and the through holes extending in the Y direction. The four holes 20, 21, 22 and 23 extending in the Z direction do not pierce through the bottom wall surface 11f of block 11, so as not to reduce the heat receiving area of the bottom wall surface 11f. By providing holes 12, 13, 14, 15, 16, 17, 18, 19, 20, 21, 22 and 23, the heat radiating area of the block can be increased. Preferably, the diameter of each hole is selected to be in the range of 5 mm to 6 mm.

In block 11, passages for circulating gas and liquid serving as heat pipes, are formed to extend in the X, Y and Z directions. FIG. 1 shows pins 51 closing end portions of openings of these passages.

Figure 3:
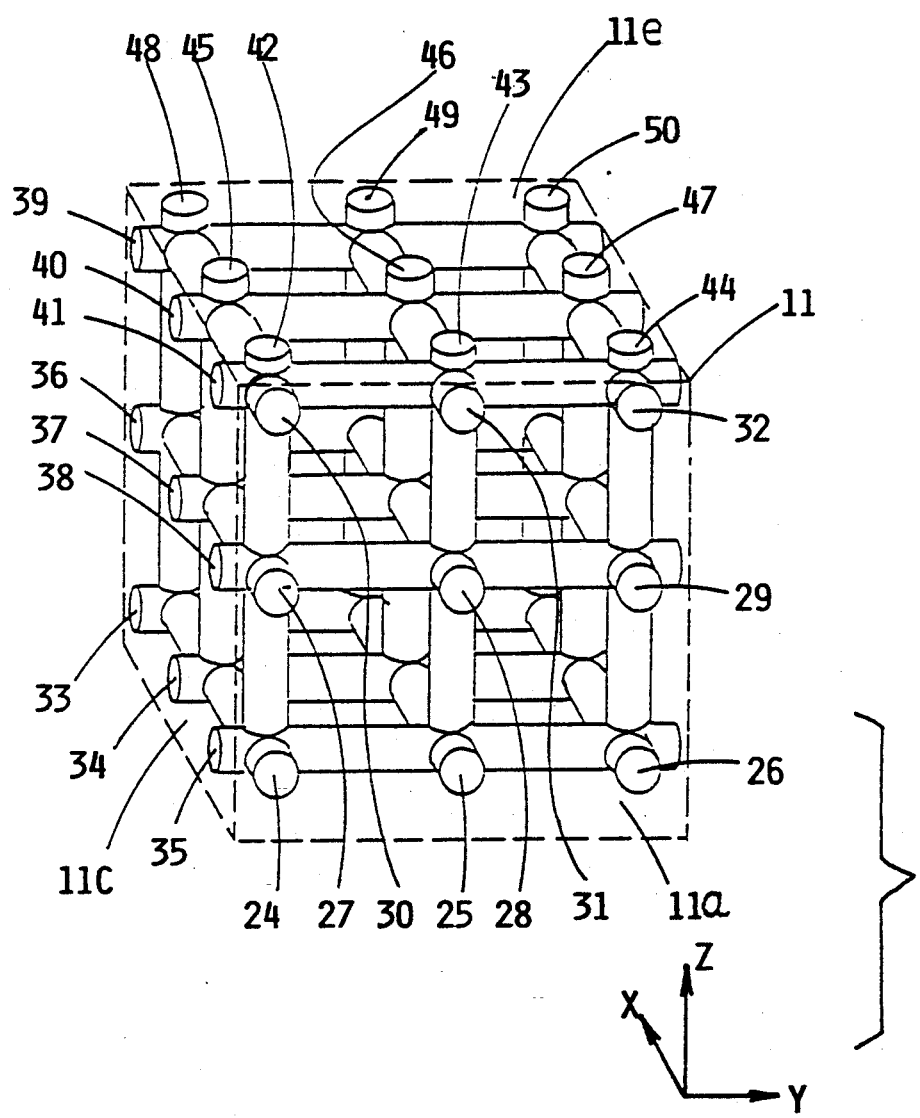
FIG. 3 is a schematic diagram showing the formation of the passages serving as a heat pipe.

FIG. 3 illustrates passages extending in the X, Y and Z directions. Referring to FIG. 3 as well as FIGS. 4 and 5, how these passages are formed will now be described. The passages for circulating gas and liquid serving as a heat pipe, include nine horizontal passage portions 24, 25, 26, 27, 28, 29, 30, 31, and 32 formed through the front wall surface 11a and through the rear wall surface 11b of block 11, nine horizontal passages 33, 34, 35, 36, 37, 38, 39, 40, and 41 formed through the left side wall surface 11c and through the side wall surface 11d of block 11, and nine vertical passages 42, 43, 44, 45, 46, 47, 48, 49, and 50 extending downwardly from the top surface 11e of block 11. Nine horizontal passages 24, 25, 26, 27, 28, 29, 30, 31, and 32 extend in the X direction, nine horizontal passages 33, 34, 35, 36, 37, 38, 39, 40, and 41 extend in the Y direction, and nine vertical passages 42, 43, 44, 45, 46, 47, 48, 49, and 50 extend in the Z direction. These passages do not cross holes 12, 13, 14, 15, 16, 17, 18, 19, 20, 21, 22, and 23 shown in FIG. 2.

Three horizontal passages 24, 25, and 26 extending in the X direction at the lowermost position, cross horizontal passages 33, 34, and 35 extending in the Y direction. Three horizontal passages 27, 28, and 29 extending in the X direction and are positioned in the middle cross horizontal passages 36, 37, and 38 extending in the Y direction. Three horizontal passages 30, 31, and 32 extending in the X direction at the uppermost position, cross horizontal passages 39, 40, and 41 extending in the Y direction. Nine vertical passages 42, 43, 44, 45, 46, 47, 48, 49, and 50 extending in the Z direction cross crossings between horizontal passages extending in the X direction and horizontal passages extending in the Y direction. In order not to reduce the heat receiving area of the bottom wall surface 11f of block 11, 9 vertical passages 42, 43, 44, 45, 46, 47, 48, 49, and 50 extending in the Z direction, do not pierce through the bottom wall surface 11f of block 11. Preferably, the diameter of each passage is selected to be in the range of 2 mm to 3 mm.

Figure 7:
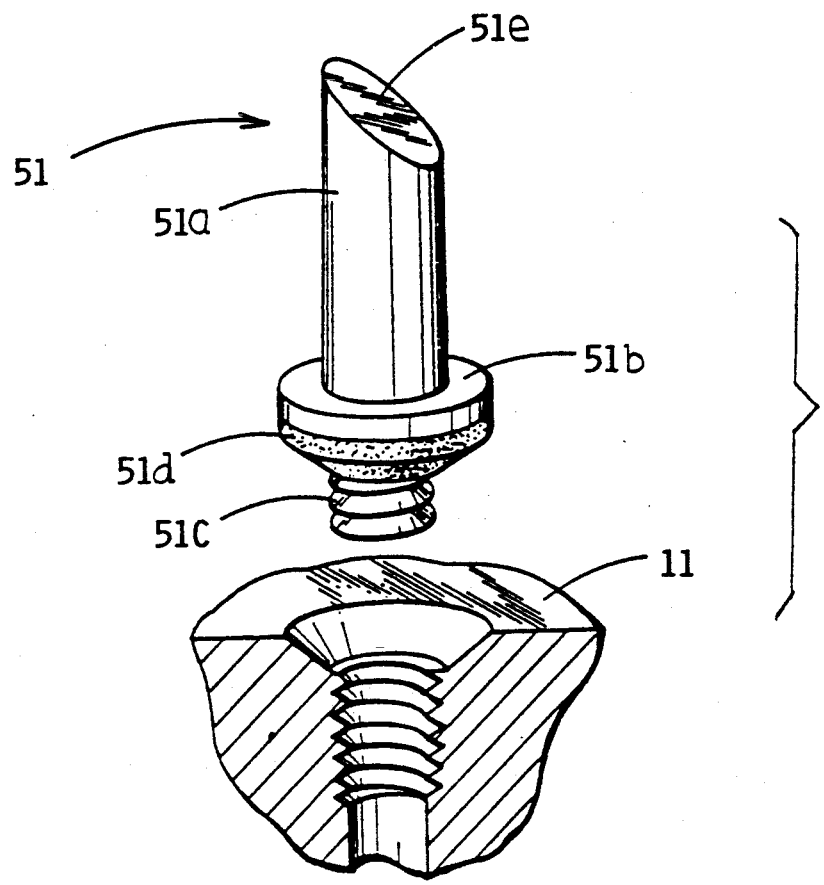
FIG. 7 is a perspective view showing a pin closing an end portion of an opening of the passage serving as the heat pipe.

An end portion of the opening of each passage is closed by a pin 51 made of aluminum. Preferring to FIG. 7, pin 51 includes a flange portion 51b, a protruding portion 51a protruding upwardly from the flange portion 51b, a screw portion 51c protruding downwardly from the flange portion 51b, and a metal packing 51d for tight-sealing the passage in block 11. At an end portion of the opening of each passage formed in block 11, a female screw is formed which engages the screw portion 51c of pin 51.

Since pin 51 closing the passage formed in block 11 has a protruding portion 51a, the surface area of the radiating device is increased, improving the heat radiating or dissipating effect. Preferably, the tip end surface 51e of protruding portion 51a of pin 51 is formed to diagonally cross the axial line of the pin so as to increase the surface area for radiation.

By closing end portions of the openings of all passages formed in block 11 by the pins 51, the passages provide an air tight space. Prior to complete closing of the passages by the pins 51, the inner pressure of the passages is reduced, and an appropriate amount of working fluid serving as a heat carrier is introduced into the passage. The amount of introduced working fluid is about 15-18% by volume of the total volume, of the closed space.

Figure 4:
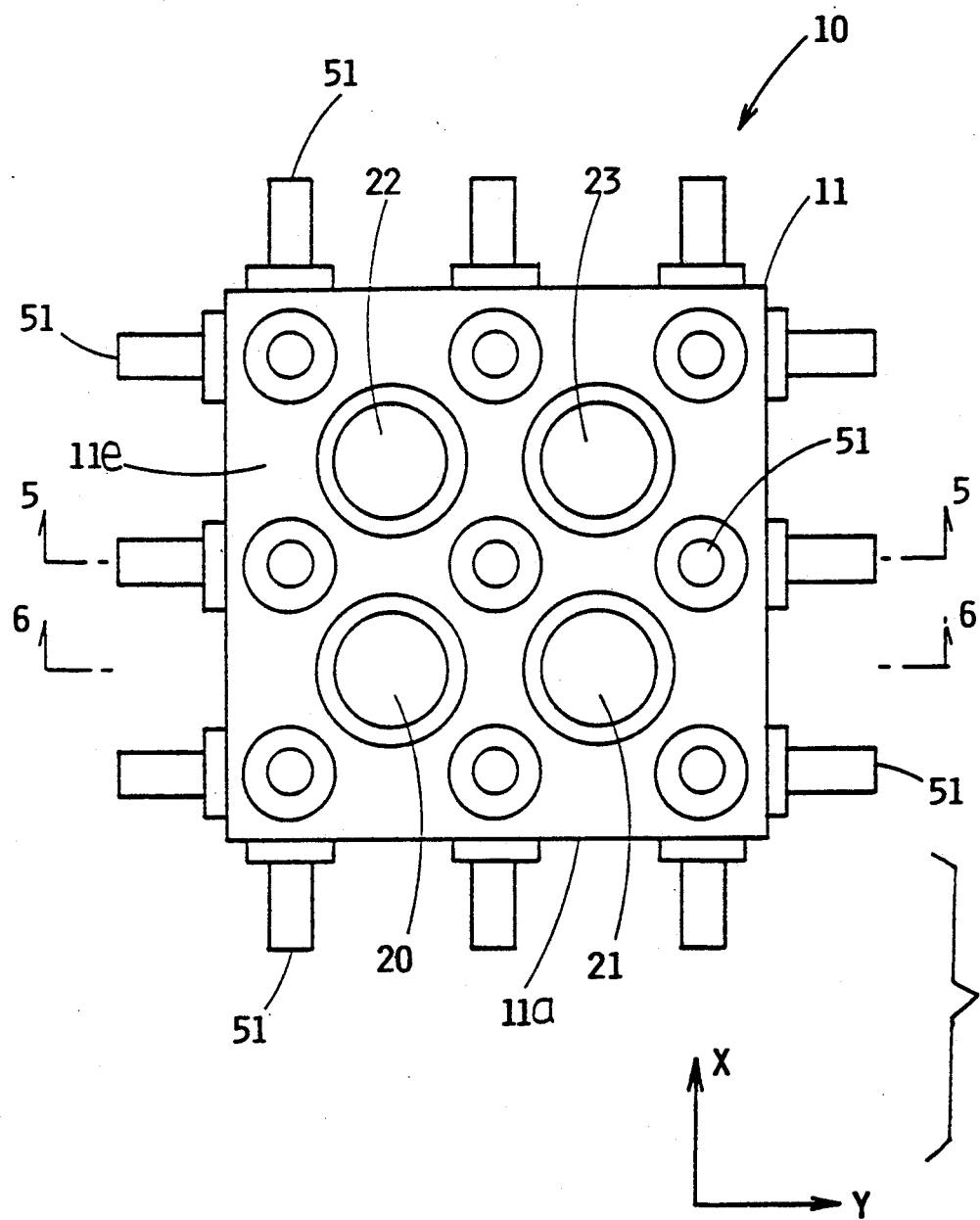
FIG. 4 is a plan view of the radiating device shown in FIG. 1.
Figure 5:
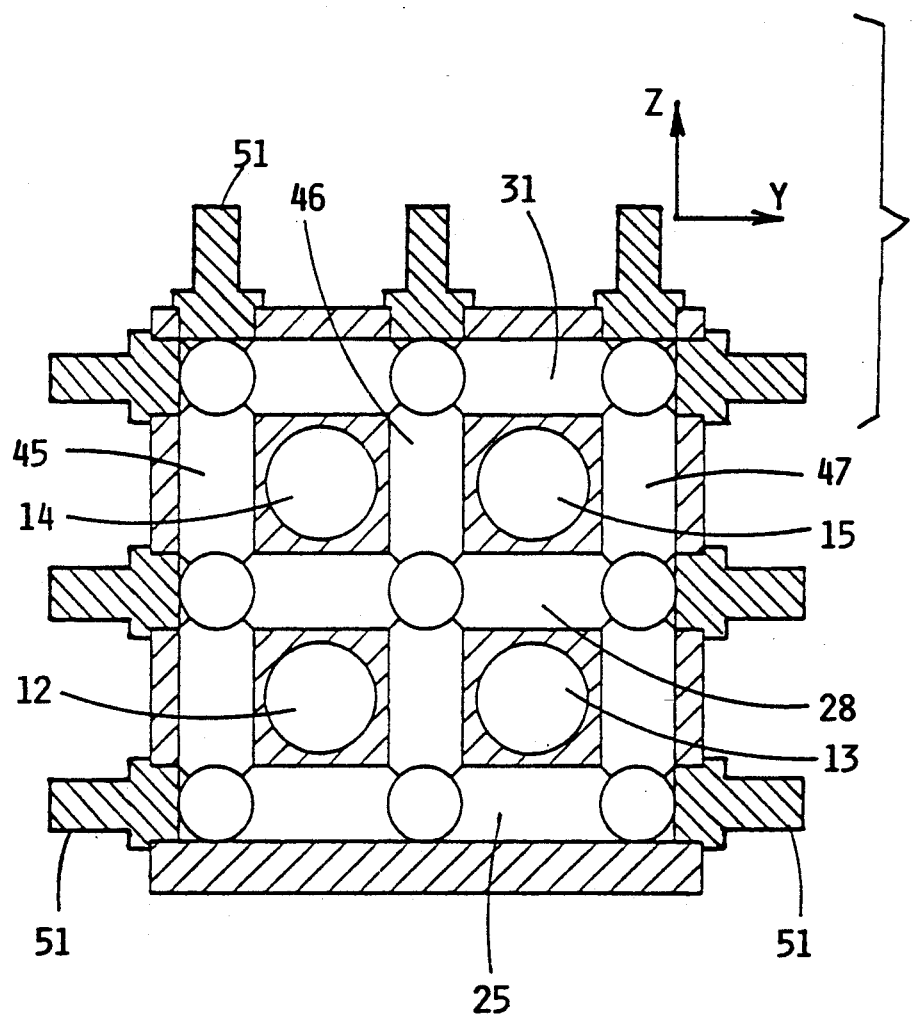
FIG. 5 is a cross section taken along the line 5—5 of FIG. 4.
Figure 6:
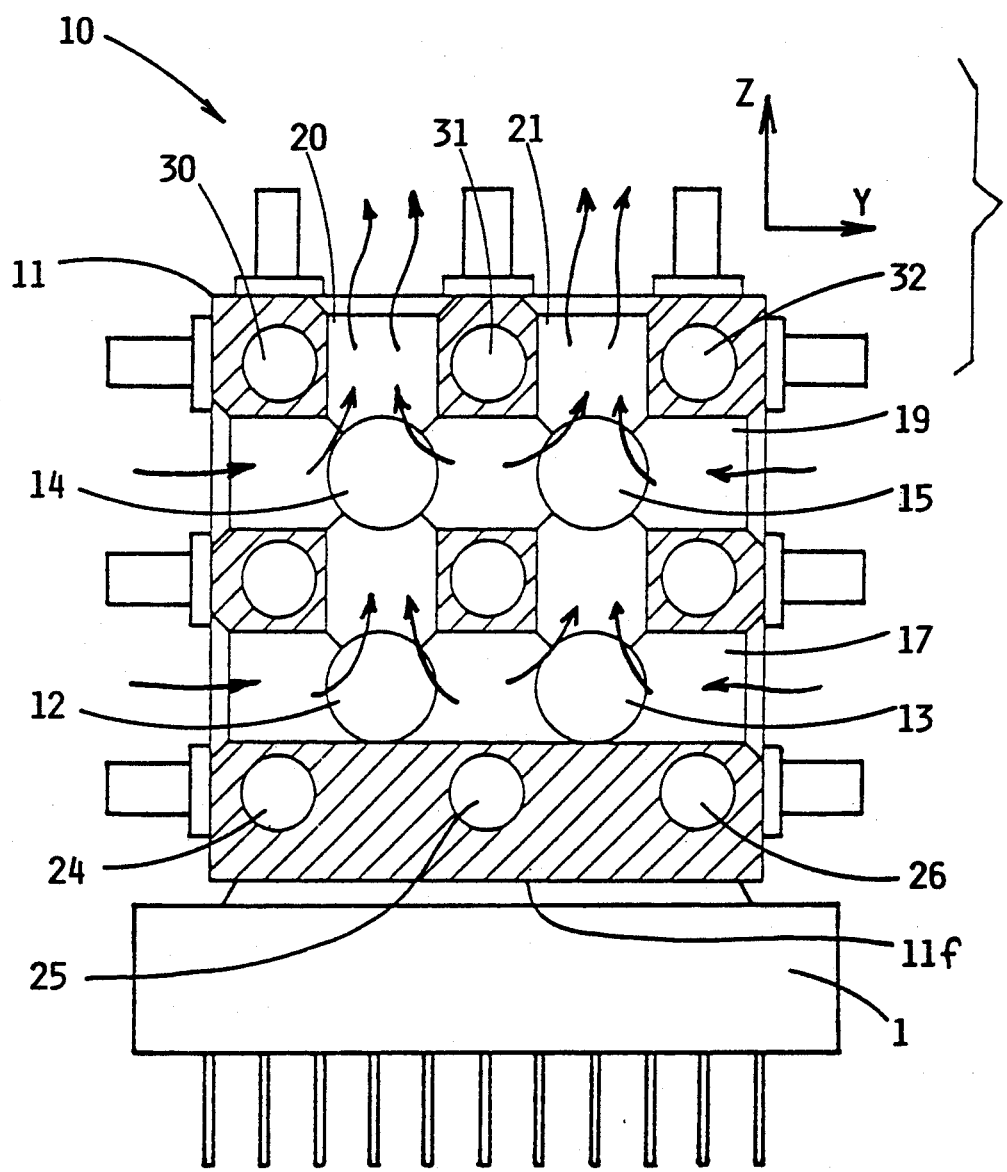
FIG. 6 is a cross section taken along the line 6—6 of FIG. 4.

FIG. 6 is a cross section taken along the line A—A of FIG. 4, showing the radiating device 10 placed on a top surface of a semiconductor integrated circuit package 1. The bottom wall surface 11f of block 11 is in surface-contact with the top surface of semiconductor integrated circuit package 1 and receives heat from semiconductor integrated circuit package 1 shown in FIG. 6. Block 11 as a whole is heated by heat conduction from the semiconductor integrated circuit package 1. Accordingly, inner wall surfaces surrounding through holes 12, 13, 14, 15, 16, 17, 18, and 19 and holes 20, 21, 22, and 23 formed in block 11 are heated, and the temperature of the air in these holes becomes higher. The heated air moves through holes 20, 21, 22 and 23 extending in the Z direction and discharged from the top wall surface 11e of block 11 to the atmosphere. Because of the discharge of the heated air to the atmosphere, the pressure in the holes is reduced. Consequently, cool air in the atmosphere is taken into the through holes 12, 13, 14, 15, 16, 17, 18, and 19 extending in the X and Y directions. The cool air introduced into the holes deprives the inner wall surfaces of heat, and again it is emitted to the atmosphere from the top wall surface 11e of block 11. By such convection of air, the radiating characteristic of the radiating device 10 is improved.

An appropriate amount of working fluid is in the passage which is closed air-tight by means of pins 51. When block 11 is not heated, the working fluid is in a liquid phase and positioned mainly in horizontal passages 24, 25, 26, 33, 34, and 35 near the bottom wall surface 11f of block 11. When the radiating device 10 is placed on the top surface of the semiconductor integrated circuit package 1 and heated, the liquid positioned at the heated portion turns into steam or gas and flows to respective passages extending in the X, Y, and Z directions. By the movement of the gas, the speed of heat transmission in block 11 is increased.

The working fluid which has turned into gas emits heat at the radiating portion and returns to liquid. The liquid flows along the inner wall surface defining the passage and returns to the heated portion. The liquid deprives the inner wall surface surrounding the passage of heat while it returns from the radiating portion to the heated portion, and again evaporated at the heating portion. By the repetition of such evaporation and condensation, the radiating effect of the radiating device is improved.

In the embodiment shown in FIGS. 1-6, the effect of radiation is improved by the function of the convection of air and by the function of the heat pipe. A radiating device having either one of the aforementioned two functions may be provided as a possible modification. Although the embodiment shown in the figure has a block of a cubic shape, the block does not necessarily have to have such a shape.

Figure 8:
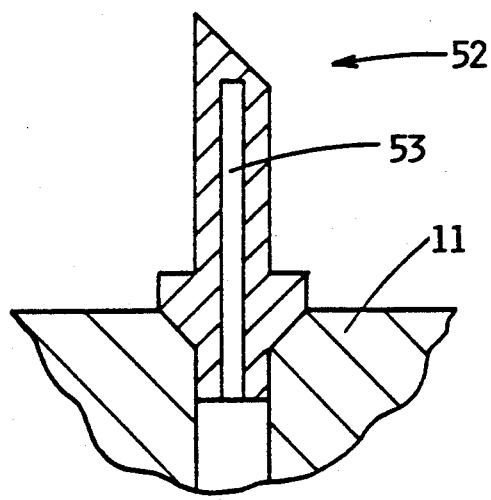
FIG. 8 is a cross section showing another example of a pin closing the passage.

FIG. 8 shows another example of the pin for closing the passage for circulating gas and liquid formed in block 1. The pin 52 shown in FIG. 8 has a hole 53 formed in the axial direction at the center. The hole 53 extends near the tip end portion of pin 52, and is communicated with the passage in block 11. Therefore, the working fluid in the form of gas flows into hole 53 and rapidly transmits heat to the vicinity of the tip end portion of pin 52. Thus, the radiating characteristic of the radiating device can be is further improved.

Figure 9:
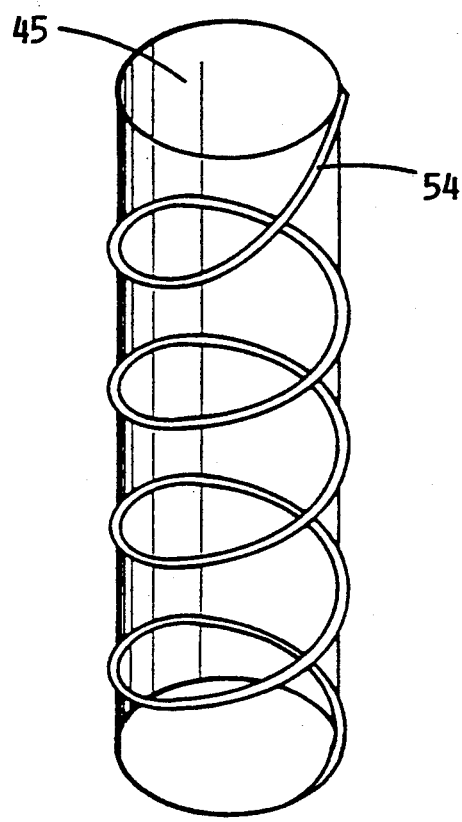
FIG. 9 is a perspective view showing a passage with a spiral groove formed thereon.

FIG. 9 illustrates a passage 45 serving as a heat pipe. A spiral groove 54 extending along the passage is preferably formed on the inner surface defining each passage. The working fluid which has been turned to liquid by condensation at the radiating portion, flows along the spiral groove 54 and returns to the heated portion. Since the liquid flows along the spiral groove 4, the liquid uniformly deprives the entire peripheral surface of the inner wall defining the passage 45, of heat.

Figure 11:
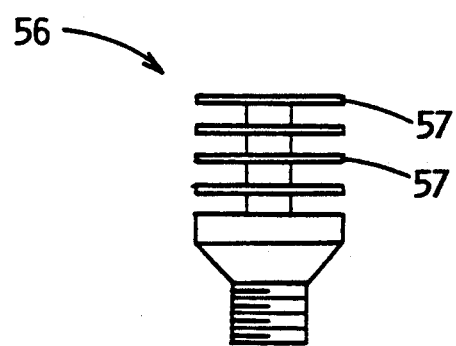
FIG. 11 is an enlarged view of the pin shown in FIG. 10.
Figure 10:
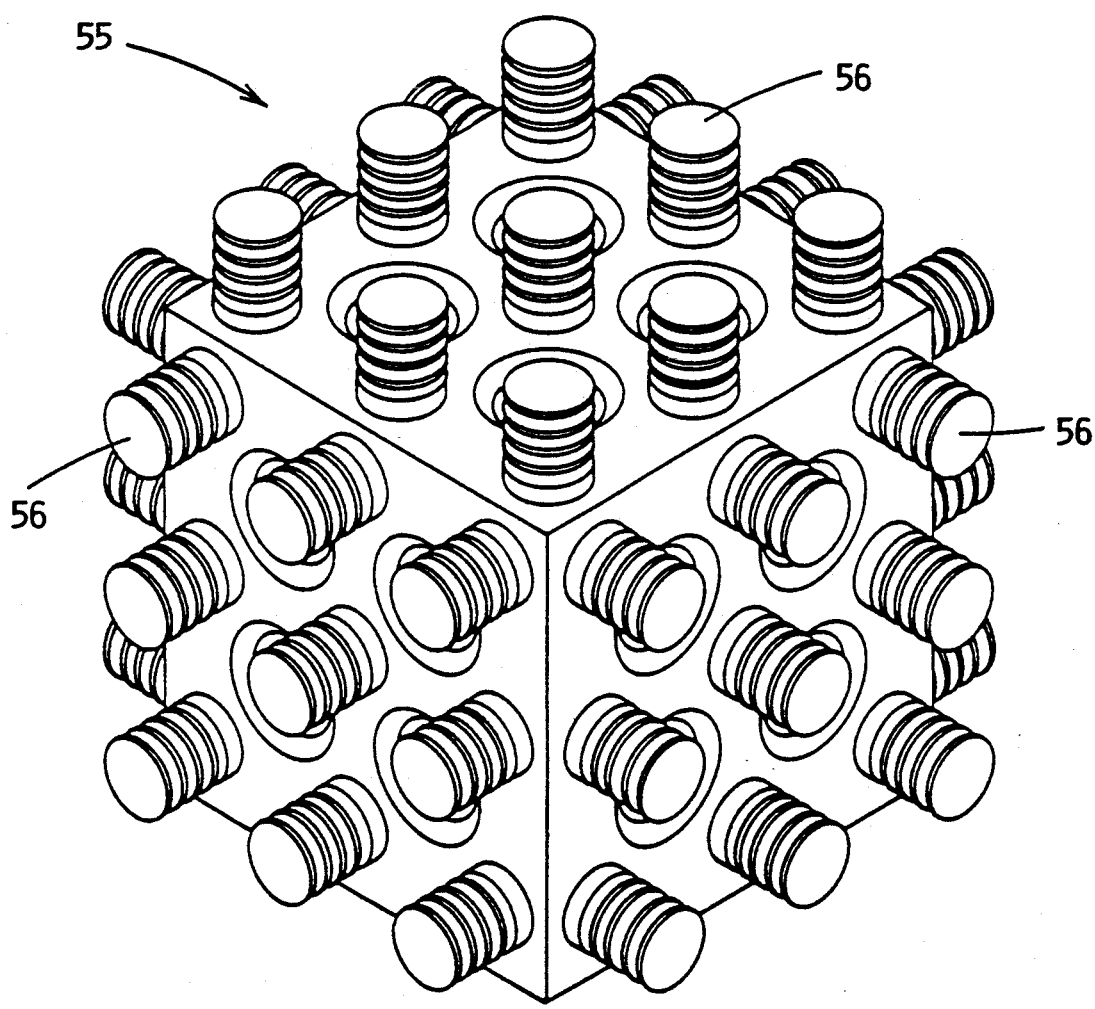
FIG. 10 is a perspective view showing another embodiment of the present invention.

FIG. 10 shows another embodiment of the present invention. The radiating device 55 shown in the FIG. 10 differs from the radiating device 10 shown in FIG. 1 in that the pin closing the passage serving as a heat pipe has a different shape. As shown in FIG. 11, the pin 56 of the radiating device 55 includes a plurality of fins 57. By forming fins 57, the radiating area of the pin 56 can be increased, improving the effect of radiation.

EXAMPLE

Figure 12:
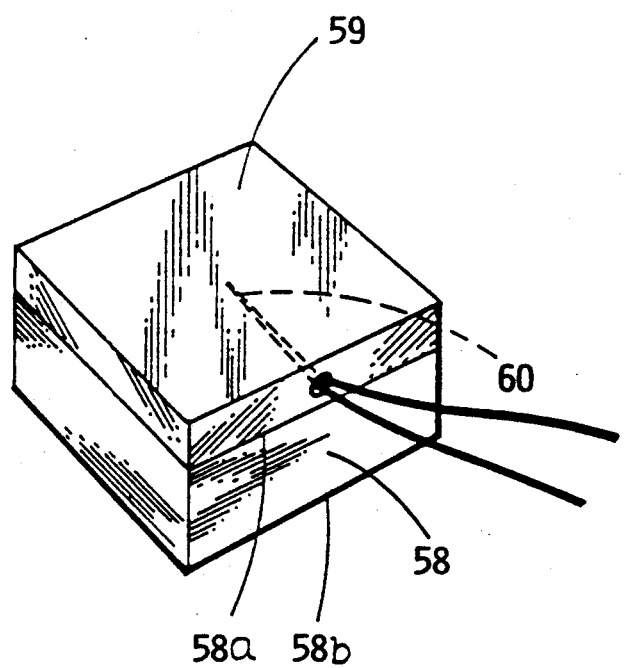
FIG. 12 is a perspective view of a Peltier element used in an experiment for confirming the radiating effect of the present radiating device.
Figure 17:
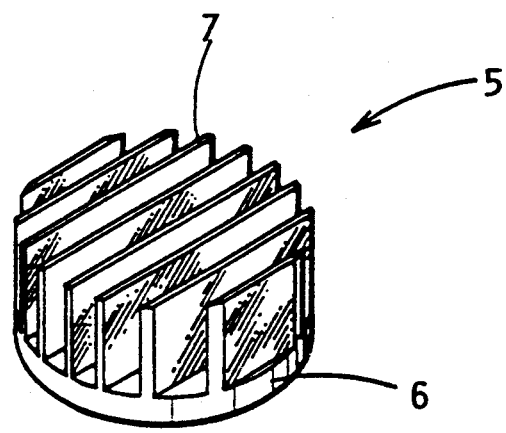
FIG. 17 is a perspective view showing another example of a conventional radiating device.

An experiment was performed to compare the radiating effect of the radiating device 10 having the structure of FIG. 1, with the radiating effect of the radiating device 5 shown in FIG. 17. A Peltier element 58 shown in FIG. 12 was prepared for the experiment for comparison. The Peltier element 58 was controlled such that the top surface 58a thereof was at 125° C. and the bottom surface 58b was at 65° C. An aluminum plate 59 having a thickness of 1 mm, was placed on the top surface of Peltier element 58. The aluminum plate 59 had a planar shape of a square, 25 mm×25 mm. A thermocoupler 60 was inserted in aluminum plate 59. The thermocoupler 60 measured the temperature at the central portion of aluminum plate 59.

Figure 13:
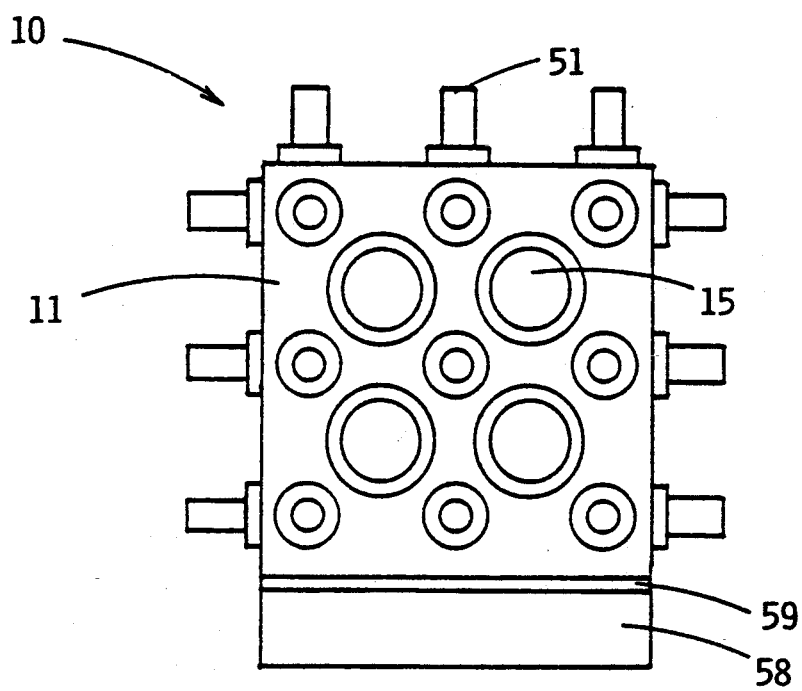
FIG. 13 shows the radiating device having the structure of FIG. 1 placed on the Peltier element.

FIG. 13 shows the radiating device 10 of FIG. 1 placed on the aluminum plate 59. The block 11 had a cubic shape with one side being 25 mm. The diameter of the hole 15 for passing the air was 5.5 mm, and the diameter of pin 51 was 2 mm. The length of the protruding portion of pin 51 was 4 mm. The diameter of the passage serving as a heat pipe was 2.5 mm.

Figure 14:
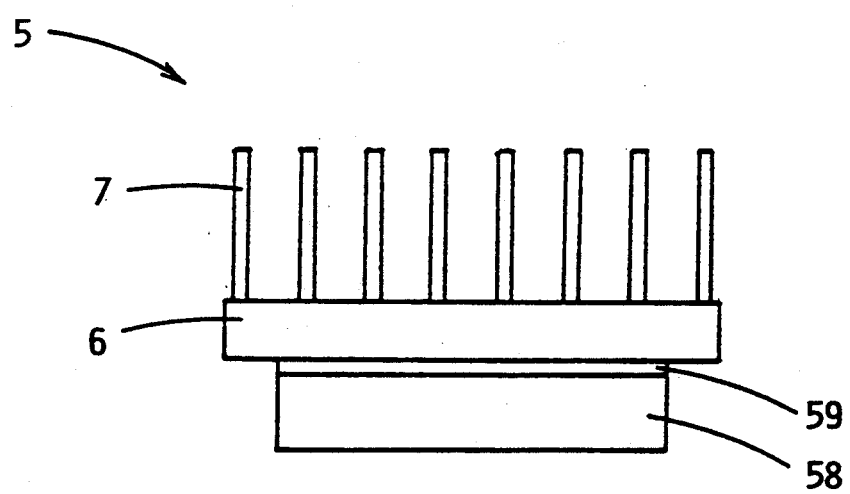
FIG. 14 shows the radiating device of FIG. 17 placed on the Peltier element.

FIG. 14 shows the radiating device 5 of FIG. 17 placed on the aluminum plate 59. The radiating device 5 was formed of aluminum, and it included a circular base plate 6 and 8 fins 7. The base plate 6 had a diameter of 38 mm and a thickness of 4 mm. The thickness of fin 7 was 1 mm and the height of the fin was 12 mm. The distance between adjacent fins 7 was 5 mm.

As shown in FIGS. 13 and 14, the temperature at which the aluminum plate 59 was kept with the radiating device placed on aluminum plate 59, was monitored. The room temperature was 20° C.

Figure 15:
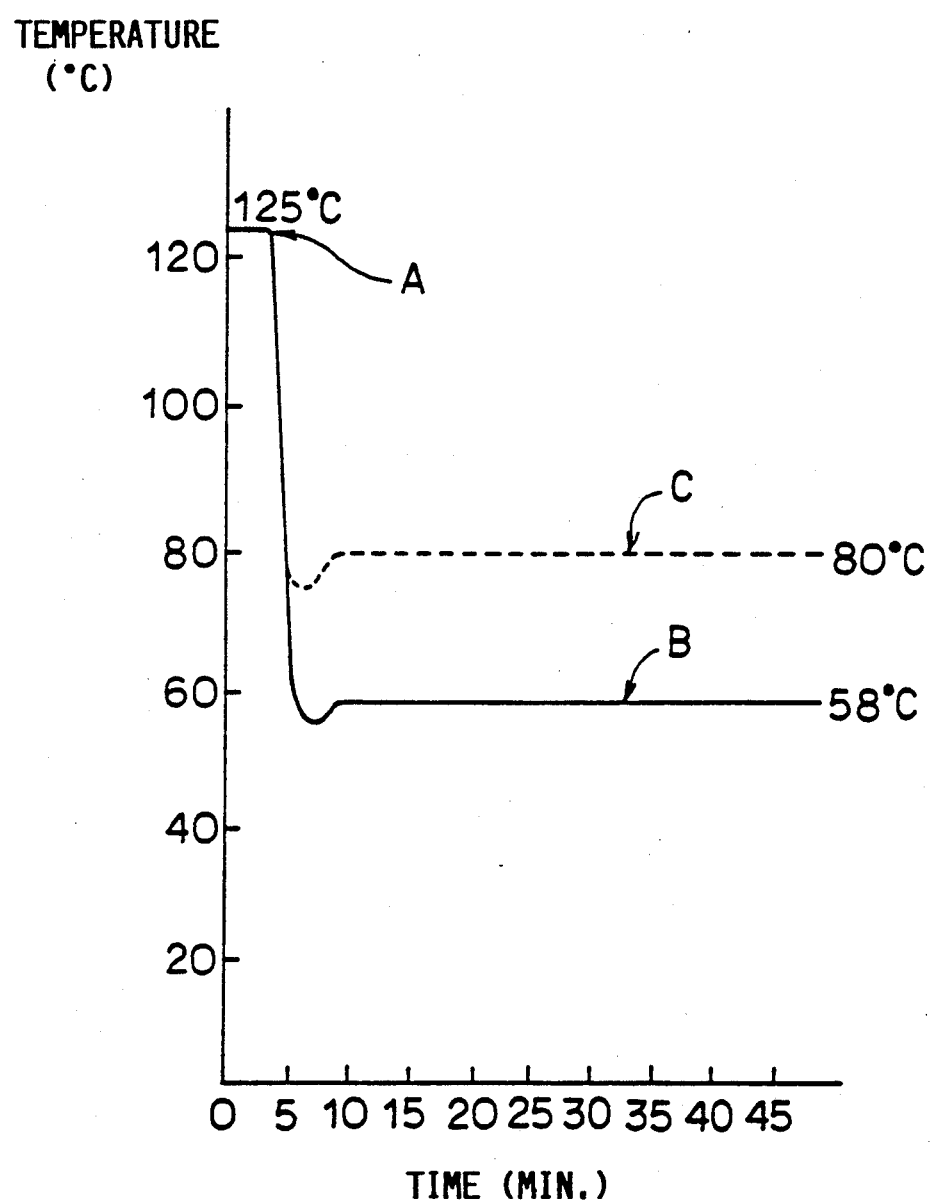
FIG. 15 is a graph showing change in temperature of the aluminum plate placed on the Peltier element.
Figure 16:
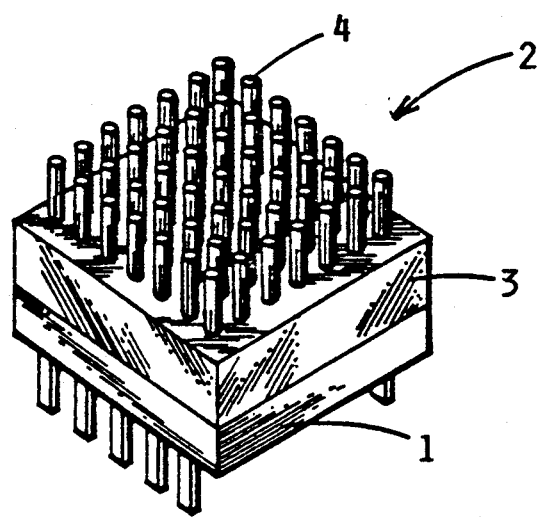
FIG. 16 is a perspective view showing an example of a conventional radiating device.

FIG. 15 shows the change in temperature of aluminum plate 59.

Referring to FIG. 15, before placing the radiating device on aluminum plate 59, the temperature of aluminum plate 59 was 125° C. At the point denoted by the arrow A, the radiating device was placed on aluminum plate 59. When the radiating device was placed on aluminum plate 59, the temperature of aluminum plate 59 was immediately and rapidly lowered, and then maintained at a constant temperature. The line denoted by the arrow B shows the example in which the radiating device 10 having the structure of FIG. 1 was placed, and the dotted line denoted by the arrow C shows the example in which the radiating device having the structure of FIG. 17 was placed. When the radiating device 10 shown in FIG. 1 was used, the temperature of aluminum plate 59 was maintained at about 58° C. Meanwhile, when the radiating device 5 having the structure of FIG. 17 was placed on plate 59, the temperature of aluminum plate 59 was maintained at about 80° C.

The result of the experiment proves that the radiating device 10 shown in FIG. 1 has superior radiating characteristic compared to that of the radiating device 5 shown in FIG. 17.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radiating device comprising a housing having a shape of a block including a bottom wall with a surface area serving as a heat receiving surface, a top wall with a surface area, and a side wall with a surface area coupling said bottom wall and said top wall for forming said housing, wherein said block includes a first group of hole means extending through said surface area of said side wall, a second group of hole means crossing said first group of hole means and extending to said top surface area, and passage means for circulating gas and liquid, said passage means serving as a heat pipe.

2. The radiating device according to claim 1, wherein said block has a rectangular parallelepiped shape defined by said bottom wall, by said side wall having four side surfaces, and by said top wall, said first group of hole means includes a plurality of through holes extending through opposing side surfaces, said second group of hole means includes a plurality of holes respectively crossing said plurality of through holes, and wherein said passage means includes a passage formed through said block and a pin closing an end portion of an opening of said passage, said pin protruding from the surface of said block.

3. The radiating device according to claim 2, wherein said first group of hole means includes a plurality of left and right through holes extending through left and right side surfaces of said block, and a plurality of front and rear through holes extending through front and rear side surfaces and respectively crossing said left and right through holes, said second group of hole means includes a plurality of holes crossing crossings of said left and right through holes and said front and rear through holes and extending to the top surface of said block, and wherein said passage means includes a plurality of left and right passages extending through left and right side surfaces, a plurality of front and rear passages extending through front and rear side surfaces and respectively crossing said left and right passages, and a plurality of vertical passages crossing crossings of said left and right passages and said front and rear passages and extending to the top surface of said block.

4. The radiating device according to claim 2, wherein said through hole has a circular cross section, the diameter of said through hole being in the range of 5 mm to 6 mm.

5. The radiating device according to claim 2, wherein a tip end surface of said pin diagonally crosses an axial line of the pin.

6. The radiating device according to claim 2, wherein said pin includes a radiating fin.

7. The radiating device according to claim 2, wherein said pin includes a hole therein communicated with said passage.

8. The radiating device according to claim 2, wherein a groove extending spirally along the passage is formed on an inner wall surface defining said passage.

9. The radiating device according to claim 1, wherein said passage means includes a passage having a circular cross-section, the diameter of said circular cross-section of said passage being in the range of 2 mm to 3 mm.

10. The radiating device according to claim 1, wherein said block is formed of aluminum.

* * * * *

UNITED STATES PATENT AND TRADEMARK OFFICE
CERTIFICATE OF CORRECTION

PATENT NO. : 5,213,153

DATED    : May 25, 1993

INVENTOR(S) : Satomi Itoh

It is certified that error appears in the above-identified patent and that said Letters Patent is hereby corrected as shown below:

Title page,
item [30] Foreign Application Priority Data add the following:

--March 3, 1992  JP  Japan ..... 4-45780--, item [57] Abstract, line 12, before "is" insert --and--, Column 8, line 25, after "surfaces" insert --of said block--.

Signed and Sealed this

Twenty-first Day of December, 1993

Attest:

BRUCE LEHMAN

Attesting Officer        Commissioner of Patents and Trademarks